(12) United States Patent
Lin et al.

(10) Patent No.: US 10,291,282 B1
(45) Date of Patent: May 14, 2019

(54) RADIO-FREQUENCY TRANSCEIVER FRONT-END CIRCUIT

(71) Applicant: National Chi Nan University, Nantou County (TW)

(72) Inventors: Yo-Sheng Lin, Taichung (TW); Kai-Siang Lan, Kaohsiung (TW)

(73) Assignee: National Chi Nan University, Nantou County (TW)

( * ) Notice: Subject to any disclaimer, the term of this patent is extended or adjusted under 35 U.S.C. 154(b) by 0 days.

(21) Appl. No.: 16/056,113

(22) Filed: Aug. 6, 2018

(30) Foreign Application Priority Data

Jun. 6, 2018 (TW) .............................. 107119459 A (51) Int. Cl.
*H01P 1/18* (2006.01)
*H03G 1/00* (2006.01)
*H04B 1/40* (2015.01)
*H03G 3/30* (2006.01)
*H03F 3/193* (2006.01)

(52) U.S. Cl.
CPC ................. *H04B 1/40* (2013.01); *H01P 1/18* (2013.01); *H03F 3/193* (2013.01); *H03G 1/0094* (2013.01); *H03G 3/3063* (2013.01); *H03F 2200/294* (2013.01)

(58) Field of Classification Search
None
See application file for complete search history.

(56) References Cited

U.S. PATENT DOCUMENTS

| 2006/0133548 | A1* | 6/2006 | Oh | .................. | H03D 3/009 |
| | | | | | 375/346 |
| 2008/0009258 | A1* | 1/2008 | Safarian | ................ | H04B 1/525 |
| | | | | | 455/307 |
| 2011/0299574 | A1* | 12/2011 | Rofougaran | ......... | H03D 7/1441 |
| | | | | | 375/219 |
| 2011/0300813 | A1* | 12/2011 | Mirzaei | .................... | H01P 5/10 |
| | | | | | 455/78 |
| 2012/0208473 | A1* | 8/2012 | Aparin | ................ | H04B 1/0458 |
| | | | | | 455/73 |
| 2015/0333781 | A1 | 11/2015 | Alon et al. | | |
| 2018/0175806 | A1* | 6/2018 | Mehrjoo | ............... | H03F 1/3205 |

* cited by examiner

*Primary Examiner* — David Bilodeau
(74) *Attorney, Agent, or Firm* — Muncy, Geissler, Olds & Lowe, P.C.

(57) ABSTRACT

An RF transceiver front-end circuit includes an antenna, a first transceiving switch, a reception processing unit, a transmission processing unit and a transmission unit. The reception processing unit includes a low-noise amplifier, a first variable gain amplifier at a back-end circuit of the low-noise amplifier, and a first phase shifter at a back-end circuit of the first variable gain amplifier, wherein a phase of the first variable gain amplifier is constant. The transmission processing unit includes a power amplifier, a second phase shifter at a front-end circuit of the power amplifier, and a second variable gain amplifier at a front-end circuit of the second phase shifter, wherein a phase of the second variable gain amplifier is constant. The transmission unit includes a transmission line and a plurality of passive phase adjustors controlled to change a phase shifting angle of a signal on the transmission line.

15 Claims, 10 Drawing Sheets

RADIO-FREQUENCY TRANSCEIVER FRONT-END CIRCUIT

FIELD OF THE INVENTION

The present invention relates to a radio-frequency (RF) transceiver front-end circuit, and particularly to an RF transceiver front-end circuit in which, when one of a gain and a phase of an RF signal is adjusted, the other that is not adjusted would not be changed with the adjustment.

BACKGROUND OF THE INVENTION

During a process of signal transmission or signal reception of a current radio-frequency (RF) transceiver front-end circuit, once one of the gain or the phase of the RF signal is adjusted, the other that is not adjusted is nonetheless affected and thus changed, such as the U.S. Patent No. US 2015/0333781 A1 discloses an RF transceiver front-end module with improved linearity. For example, when the RF transceiver front-end circuit changes the gain of the RF signal because the RF signal is too weak, although the RF transceiver front-end circuit does not adjust the phase of the RF signal, the phase of the RF signal is changed due to the architecture of the current RF transceiver front-end circuit.

SUMMARY OF THE INVENTION

It is a primary object of the present invention to resolve the issue of a current radio-frequency (RF) transceiver front-end circuit, in which, when the gain or the phase of a RF signal is changed, the other is also caused to change.

To achieve the above object, the present invention provides an RF transceiver front-end circuit including an antenna, a first transceiving switch, a reception processing unit, a transmission processing unit and a transmission unit. The first transceiving switch connected to the antenna comprises a first signal receiving path and a second signal transmitting path. The reception processing unit includes a low-noise amplifier (LNA) connected to the first signal receiving path, a first variable gain amplifier provided at a back-end circuit of the low-noise amplifier, and a first phase shifter provided a back-end circuit of the first variable gain amplifier, wherein the phase of the first variable gain amplifier is constant. The transmission processing unit includes a power amplifier connected to the first signal transmitting path, a second phase shifter provided at a front-end circuit of the power amplifier, and a second variable gain amplifier provided at a front-end circuit of the second phase shifter, wherein the phase of the second gain amplifier is constant. The transmission unit is connected to the first phase shifter and the second variable gain amplifier. The transmission unit includes a transmission line, and a plurality of passive phase adjustors individually provided correspondingly to the transmission line and controlled to change a phase shifting angle of the RF signal on the transmission line.

In one embodiment, phase shifting ranges of the plurality of passive phase adjustors are at least 180 degrees. Further, a phase shifting angle of each of the first phase shifter and the second phase shifter is 180 degrees.

In one embodiment, the RF transceiver front-end circuit includes a controller connected to the plurality of passive phase adjustors. The controller includes a plurality of identifiers respectively corresponding to the plurality of passive phase adjustors, and controls the plurality of passive phase adjustors according to the plurality of identifiers.

In one embodiment, each of the plurality of passive phase adjustors includes a variable inductor and a variable capacitor. The variable inductor is connected to the transmission line and is controlled to change the phase of the RF signal transmitted on the transmission line. The variable capacitor is connected to the transmission line and is controller to change the RF signal transmitted on the transmission line. The controller includes a main control unit, a plurality of third switches individually connected to the main control unit and controlled to change a status of one of the variable inductors, and a plurality of fourth switches individually connected to the main control unit and controlled to change a status of one of the variable capacitors.

In one embodiment, each of the plurality of passive phase adjustors includes a variable resistor connected to the transmission line and controlled to change loss of the RF signal transmitted on the transmission line, and the controller includes a plurality of fifth switches individually connected to the main control unit and controlled to change a status of one of the plurality of variable resistors.

In one embodiment, the transmission unit is a slow-wave artificial transmission line.

In one embodiment, each of the first phase shifter and the second phase shift is a switch cascade circuit.

In one embodiment, the RF transceiver front-end circuit further includes a second transceiving switch connected to the transmission unit, the reception processing unit and the transmission processing unit. The second transceiving switch includes a second signal receiving path connected to the transmission line and the first phase shifter, and a second signal transmitting path connected to the transmission line and the second variable gain amplifier.

With the above disclosure of the present invention, the present invention provides following features compared to the prior art. In the present invention, the RF transceiver front-end circuit achieves accurate beam control, and calibration is significantly simplified through orthogonal phase and gain control of the RF transceiver front-end circuit of the present invention. In addition, when using the present invention to adjust one of the phase and the gain of the RF signal, the other is not change with the adjustment, thus further significantly simplifying the control of the RF transceiver front-end circuit.

DETAILED DESCRIPTION OF THE PREFERRED EMBODIMENTS

Details and technical contents of the present invention are given with the accompanying drawings below.

Figure 1:
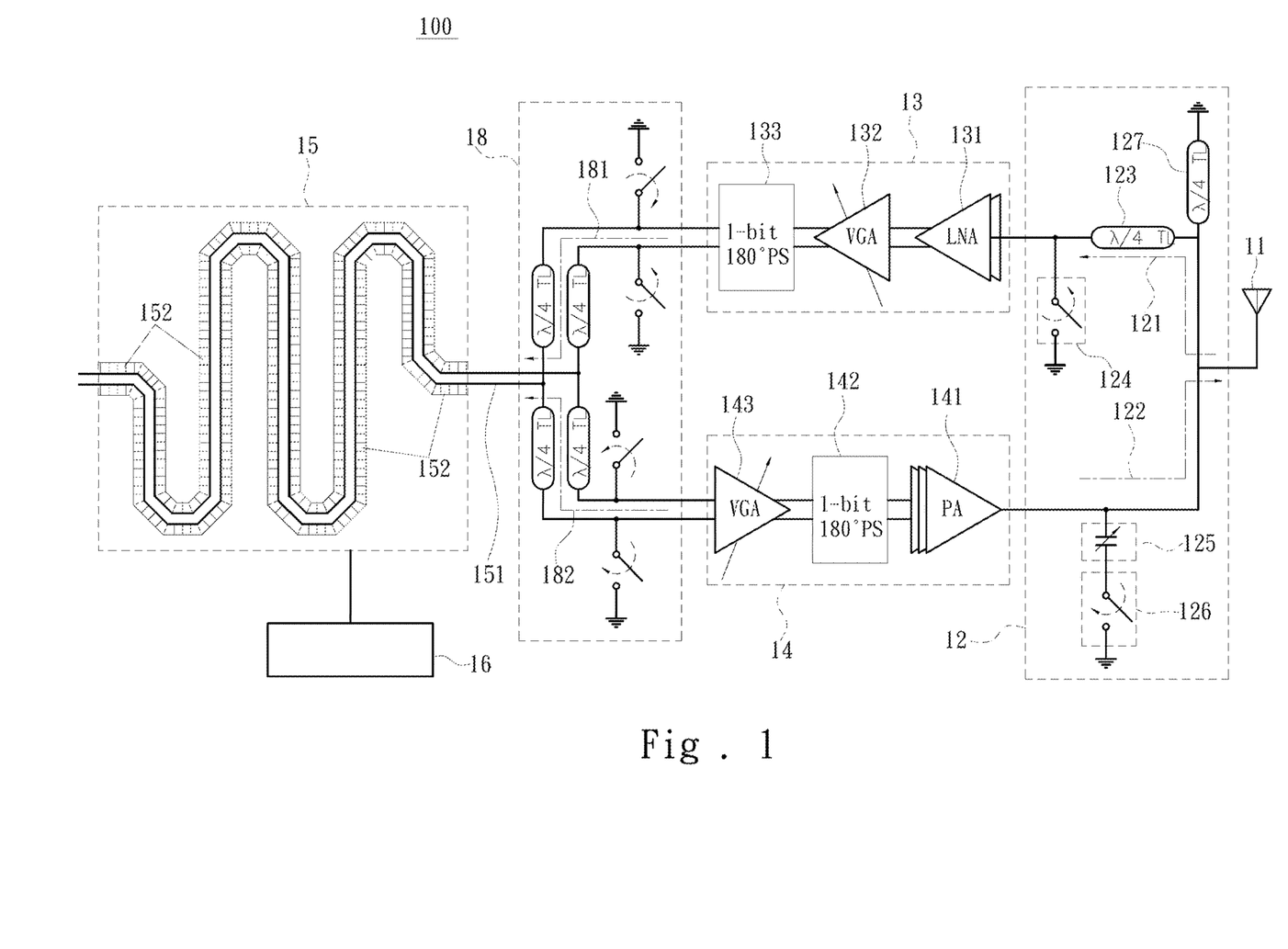
FIG. 1. is a schematic diagram of units according to one embodiment of the present invention.

Referring to FIG. 1, the present invention provides a radio-frequency (RF) transceiving front-end circuit 100, which may be applied in a Fifth Generation (5G) communication system. The RF transceiving front-end circuit 100 is primarily used for receiving or transmitting an RF signal. The RF transceiving front-end circuit 100 includes an antenna 11, a first transceiving switch 12, a reception processing unit 13, a transmission processing unit 14 and a transmission unit 15.

The first transceiving switch 12 is connected to the antenna 11, and comprises a first signal receiving path 121 connected to the reception processing unit 13 and a first signal transmitting path 122 connected to the transmission processing unit 14. In one embodiment, the first signal receiving path 121 includes a first λ/4 transmission line 123 and a first switch 124. The first switch 124 is conducted or cut off according to whether the RF transceiving front-end circuit 100 receives the RF signal. When the RF transceiving front-end circuit 100 receives the RF signal, the first switch 124 is controlled to become cut off such that the RF signal received via the antenna 11 and forwarded to the first signal receiving path 121 enters the reception processing unit 13. On the other hand, when the RF transceiving front-end circuit 100 transmits the RF signal, the first switch 124 is controlled to become conducted such that the first signal receiving path 121 is short circuited to prevent the RF signal from entering the reception processing unit 13. Further, the first signal transmitting path 122 includes a digital switch capacitor 125 and a second switch 126 connected in series to the digital switch capacitor 125 but excludes any λ/4 transmission line. The second switch 126 is conducted or cut off according to whether the RF transceiving front-end circuit 100 transmits the RF signal. When the RF transceiving front-end circuit 100 transmits the RF signal, the second switch 126 is cut off such that the transmitted RF signal enters the antenna 11. When the RF transceiving front-end circuit 100 receives the RF signal, the first switch 124 is controlled to become conducted, and the digital switch capacitor 125 incorporates the inductive power of the antenna 11 to the operating frequency and produces a resonant open circuit, such that the RF signal received by the antenna 11 does not enter the transmission processing unit 14. Moreover, the first signal receiving path 121 may further include a second λ/4 transmission line 127, which provides the first signal receiving path 121 with electrostatic discharge protection.

Figure 2:
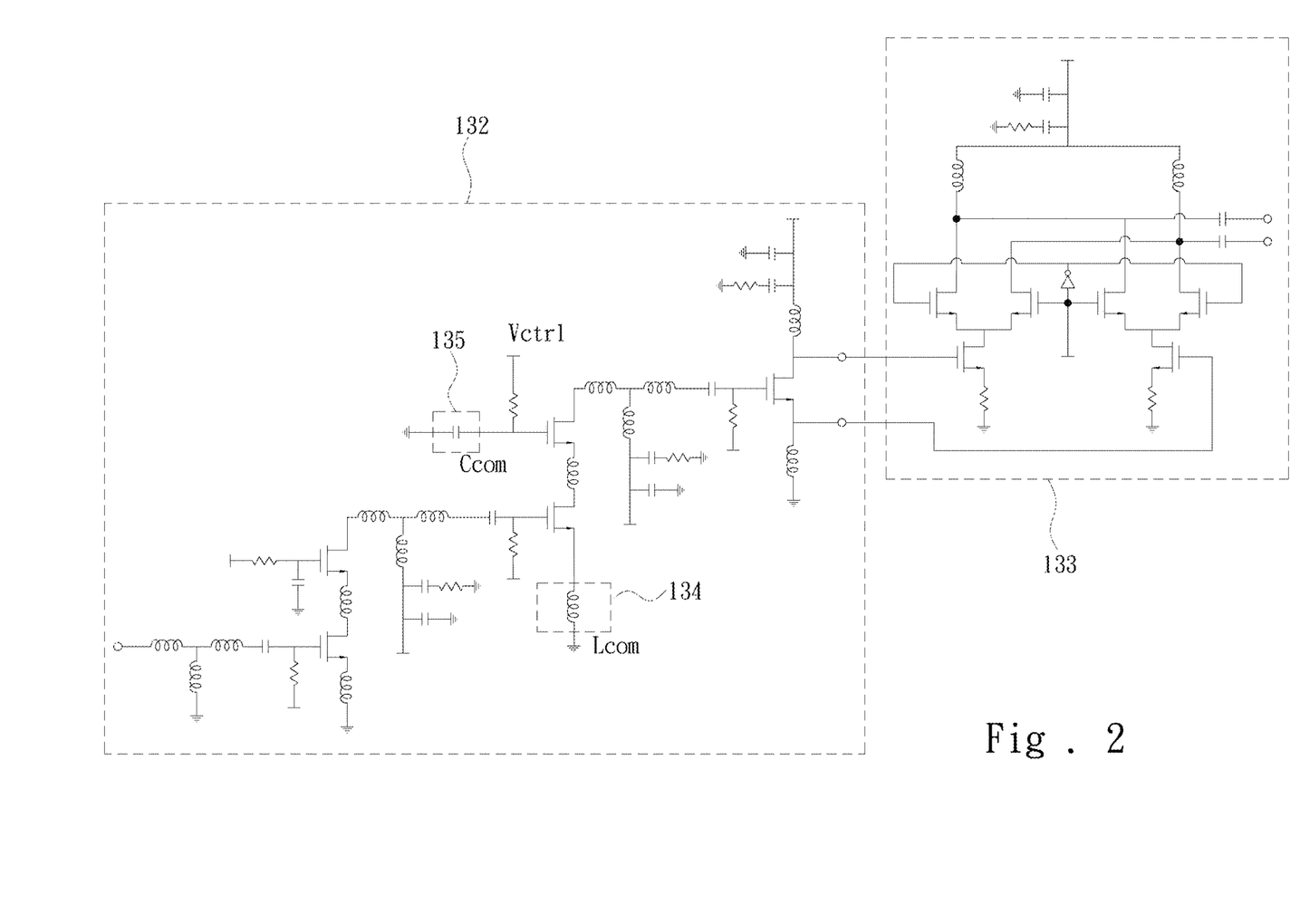
FIG. 2 is a circuit schematic diagram of a reception processing unit according to one embodiment of the present invention.
Figure 3:
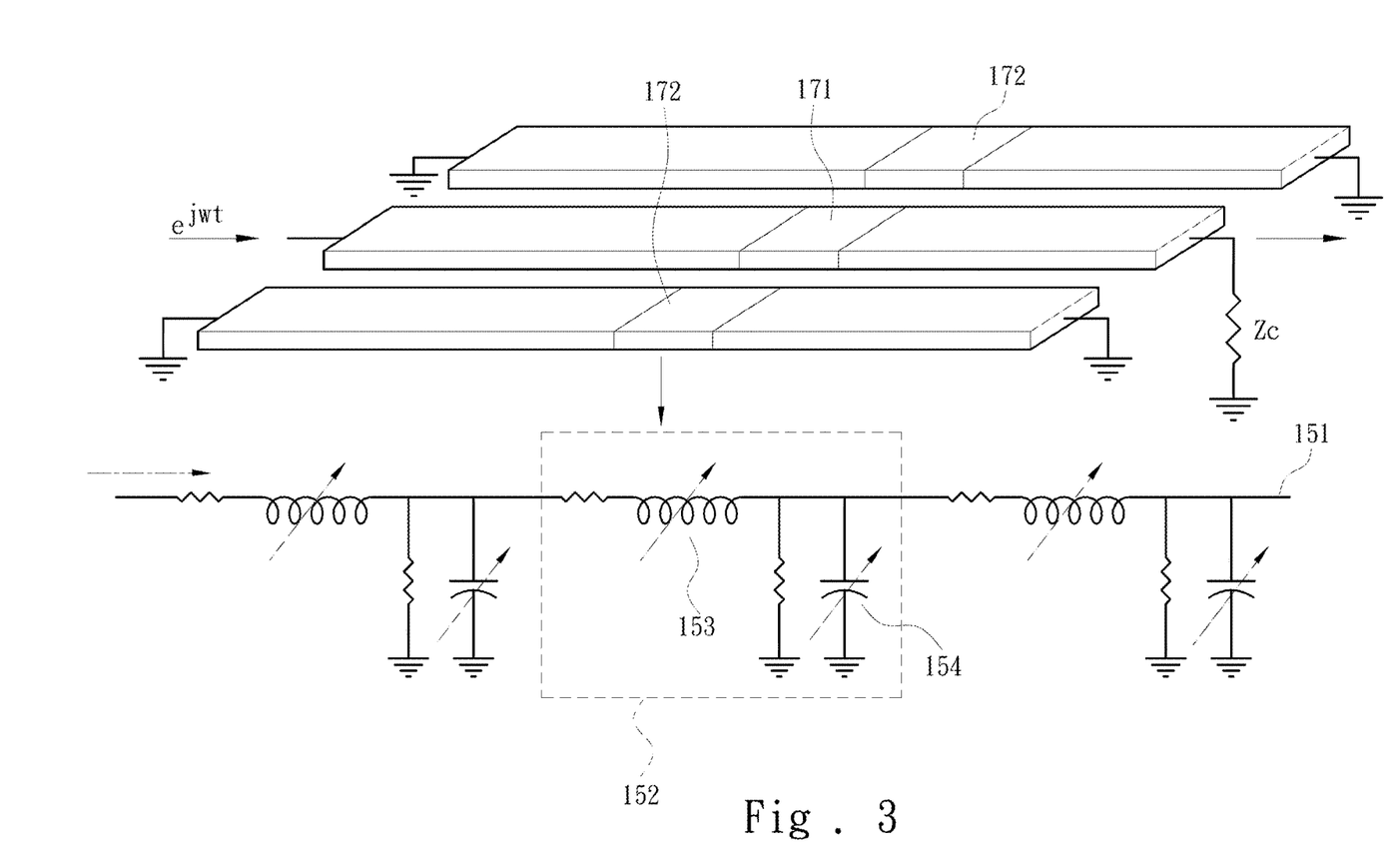
FIG. 3 is an equivalent circuit diagram of a passive phase adjustor according to one embodiment of the present invention.

Referring to FIG. 1 and FIG. 2, the reception processing unit 13 includes a low-noise amplifier (LNA) 131 connected to the first signal receiving path 121, a first variable gain amplifier 132 provided at a back-end circuit of the LNA 131, and a first phase shifter 133 provided at a back-end circuit of the first variable gain amplifier 132. The reception processing unit 13 is connected to the first signal receiving path 121 via an input end of the LNA 131, and an output end of the LNA 131 is connected to the first variable gain amplifier 132. The first variable gain amplifier 132 performs gain adjustment on the received RF signal, and the so-called "gain adjustment" is achieved by modifying a control voltage (Vctrl) of the first variable gain amplifier 132. The first variable gain amplifier 132 may be implemented by a three-stage voltage amplifier, and does not generate any phase change of the RF signal during the implementation process. That is to say, the first variable gain amplifier 132 has a constant phase. Further, the first phase shifter 133 is directly connected in series to the first variable gain amplifier 132. The first variable gain amplifier 132 is implemented by a switch cascade circuit that includes a phase compensating inductor (Lcom) 134 and a phase compensating capacitor (Ccom) 135. By controlling the statuses of the phase compensating inductor 134 and the phase compensating capacitor 135, the phase of the RF signal received by the first phase shifter 133 is changed. Further, the phase shifting angle of the first phase shifter 133 is 180 degrees.

Furthermore, the transmission processing unit 14 includes a power amplifier (PA) 141 connected to the first signal transmitting path 122, a second phase shifter 142 provided at a front-end circuit of the power amplifier 141, and a second variable gain amplifier 143 provided at a front-end circuit of the second phase shifter 142. The transmission processing unit 14 is connected to the first signal transmitting path 122 via an output end of the power amplifier 141, and an input end of the power amplifier 141 is connected to the second phase shifter 142. The second phase shifter 142 is directly connected in series with the second variable gain amplifier 143, and is connected to an output end of the second variable gain amplifier 143. Further, the second phase shifter 142 has an identical structure with the first phase shifter 133 and is a switch cascade circuit. That is to say, the phase shifting angle of the second phase shifter 142 is also 180 degrees. In addition, an output end of the second variable gain amplifier 143 is connected to an input end of the second phase shifter 142. The second variable gain amplifier 143 adjusts the gain of the RF signal to be transmitted. The function of the second variable gain amplifier 143 is as same as the first variable gain amplifier 132 that generates a change in the gain by modifying the control voltage. That is to say, the second variable gain amplifier 143 is also implemented by a three-stage voltage amplifier. Further, during the implementation process, the second variable gain amplifier 143 does not cause a change in the phase of the RF signal; that is, the second variable gain amplifier 143 has a constant phase.

Furthermore, the transmission unit 15 is connected to the first phase shifter 133 and the second variable gain amplifier 143. More specifically, the transmission unit 15 may be a slow-wave artificial transmission line, which includes a transmission line 151 and a plurality of passive phase adjustors 152 individually provided correspondingly to the transmission line 151. The transmission line 151 is connected to an output end of the first phase shifter 133 and an input end of the second variable gain amplifier 143. Further, the plurality of passive phase adjustors 152 are sequentially connected to the transmission line 151, and each of the plurality of passive phase adjustors 152 is independently controlled. The plurality of passive phase adjustors 152 is controlled to change a phase shifting angle of the RF signal on the transmission line 151, wherein the phase shifting angles changed by the plurality of passive phase adjustors 152 are equal. Thus, the plurality of passive phase adjustors 152 may be integrated into one phase adjusting device, and each of the plurality of passive phase adjustors 152 may be regarded as one operating bit. When the number of the plurality of passive phase adjustors 152 included in the phase adjusting device is eighty-eight, the phase adjusting device is referred to an 88-bit phase adjusting device. Further, in order to achieve a 360-degree phase shifting angle, the phase adjusting angles of the plurality of passive phase adjustors 152 correspond to the phase adjusting angles the first phase shifter 133 or the second phase shifter 142. More specifically, when the maximum phase shifting angle of the first phase shifter 133 (or the second phase shifter 142) is 180 degrees, the total phase shifting range of the plurality of passive phase adjustors 152 needs to be at least 180 degrees to achieve a 360-degree phase shifting range. Besides, since the phase shifting angles of the plurality of passive phase adjustors 152 are equal, the 180 degrees are evenly divided among the plurality of passive phase adjustors 152 according to the number of the plurality of passive phase adjustors 152. For example, when the transmission unit 15 is provided with only fourty-four passive phase adjustors 152, the phase shifting angle of each passive phase adjustor 152 needs to be 2.25 degrees, and the passive phase adjustors 152 then achieve a total phase shifting range of 198 degrees. Thus, with the first phase shifter 133 or the second phase shifter 142 applied in conjunction, a 378-degree phase range is generated and fully cover the whole phase range. Furthermore, the RF transceiving front-end circuit 100 includes a controller 16 connected to the plurality of passive phase adjustors 152. The controller 16 includes a plurality of identifiers, which are respectively corresponding to each of the plurality of passive phase adjustors 152, wherein the plurality of identifiers are non-repetitive. The controller 16 controls the plurality of passive phase adjustors 152 based on the plurality of identifiers. For example, one of the plurality of passive phase adjustors 152 is corresponding to the identifier 001 and another passive phase adjustor 152 is corresponding to the identifier 010. The above example is given on the basis of binary coding, and the present invention is not limited thereto. In one embodiment, the plurality of passive phase adjustors 152 performs coding on the basis of thermometer-coding. Thus, the controller 16 is able to independently control each of the plurality of passive phase adjustors 152, thereby reliably controlling the phase shifting degree of the RF signal on the transmission line 151.

Further, referring to FIGS. 3, 4, 5 and 6, each of the plurality of passive phase adjustors 152 includes a variable inductor 153 connected to the transmission line 151 and controlled to change the phase of the RF signal transmitted on the transmission line 151, and a variable capacitor 154 connected to the transmission line 151 and controlled to change the RF signal transmitted on the transmission line 151. The activation of the variable inductor 153 and the variable capacitor 154 affects the equivalent inductance value and the equivalent capacitance value of each of the plurality of passive phase adjustors 152, thus changing the transmission speed of the transmission line 151 corresponding to the passive phase adjustor 152. Further, the controller 16 includes a main control unit 161, a plurality of third switches 162 individually connected to the main control unit 161 and controlled to change the status of one of the variable inductors 153, and a plurality of fourth switches 163 individually connected to the main control unit 161 and controlled to change the status of one of the variable capacitors 154. The numbers of the third switches 162 and the fourth switches 163 are determined by the number of the passive phase adjustors 152. Moreover, the plurality of third switches 162 is a transistor and the plurality of fourth switches 163 is a field-effect transistor. Whether each of the plurality of third switches 162 is conducted or cut off determines whether the variable inductor 153 is to be incorporated to the transmission line 151. More specifically, when the plurality of third switches 162 are conducted, the variable inductor 153 is incorporated to the transmission line 151 such that the RF signal transmitted on the transmission line 151 generates a phase shift. Conversely, when the plurality of third switches 162 are cut off, the variable inductor 153 is not incorporated to the transmission line 151. Furthermore, whether the plurality of third switches 162 are conducted or cut off determines whether the variable capacitor 154 is connected to the transmission line 151. More specifically, when the plurality of third switches 162 are conducted, the variable capacitor 154 is connected to the transmission line 151. Therefore, the transmission line 151 has a capacitor load characteristic, which generates a phase shift of the RF signal on the transmission line 151.

Figure 4:
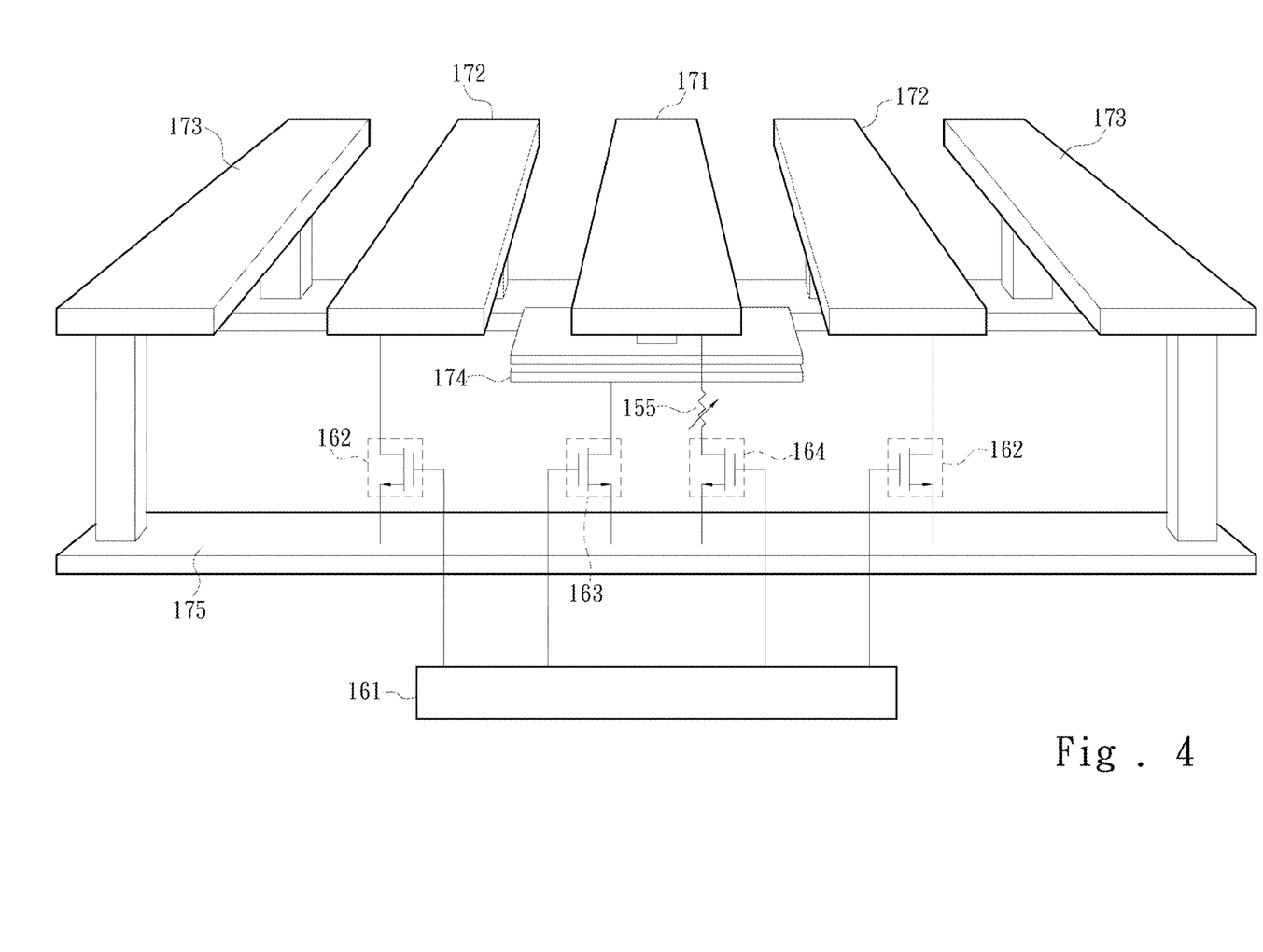
FIG. 4 is a schematic diagram of an integrated structure of a transmission unit according to one embodiment of the present invention.

Referring to FIGS. 1 and 4, the transmission unit 15 is implemented in form of an integrated circuit. Wherein, the transmission line 151 is implemented by a first metal conductor 171, and the passive phase adjustors 152 is implemented by a second metal conductor 172 and a third metal conductor 173. The second metal conductor 172 and the third metal conductor 173 are arranged side by side to make the first metal conductor 171 be located at a center position, and are capable of electrically connecting to the first metal conductor 171. And, a capacitor structure 174 electrically connected to the first metal conductor 171. The second metal conductor 172 and the third metal conductor 173 are respectively implemented in plural quantities. Among The second metal conductors 172 and the third metal conductors 173, the one (i.e., the second metal conductors 172) close to the first metal conductor 171 may implement a low delay mode of the transmission unit 15, whereas the one (i.e., the third metal conductors 173) away from the first metal conductor 171 may implement a high delay mode of the transmission unit 15. And, two adjacent of the second metal conductors 172 and the third metal conductors 173 are electrically connected. Besides, the second metal conductors 172 implementing the low delay mode are individually connected to the plurality of third switches 162, and the third metal conductors 173 implementing the high delay mode are individually connector to a ground metal plate 175. The capacitor structure 174 is connected to the fourth switch 163. Further, the plurality of third switches 162 and the plurality of fourth switches 163 are implemented by transistor semiconductor structures or field-effect transistor semiconductor structures.

Figure 5:
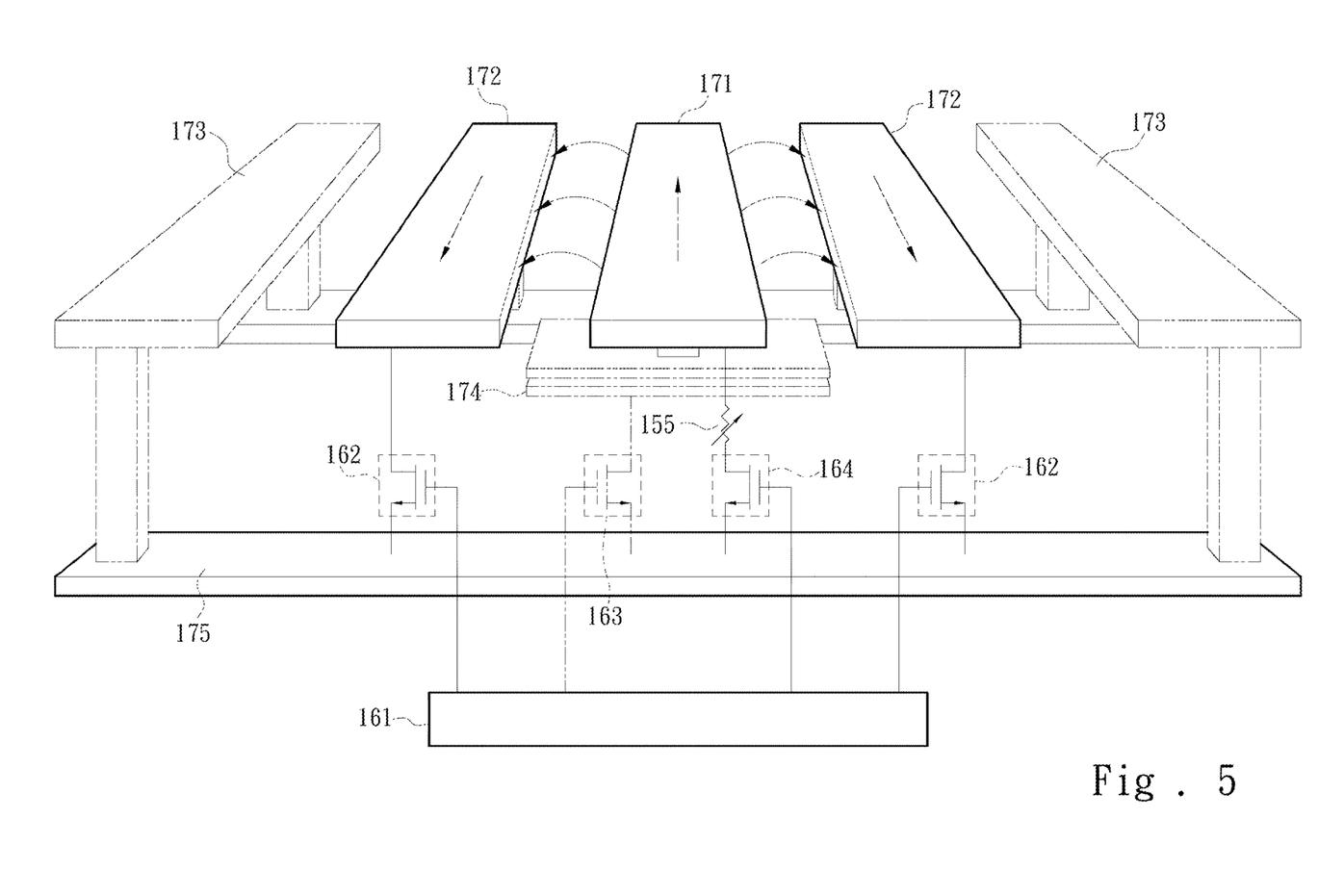
FIG. 5 is a status schematic diagram of a transmission unit in a low delay mode according to one embodiment of the present invention.
Figure 6:
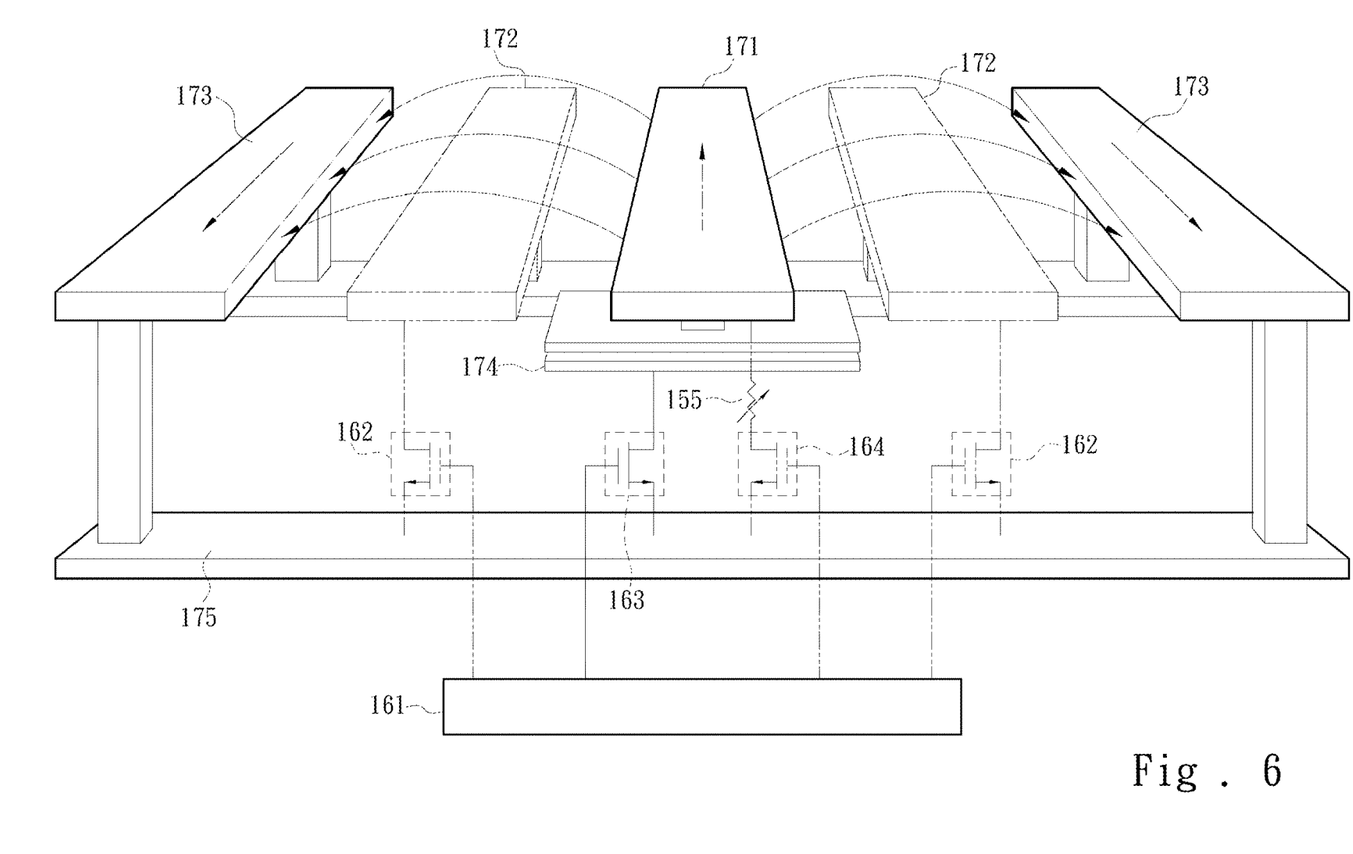
FIG. 6 is a status schematic diagram of a transmission unit in a high delay mode according to one embodiment of the present invention.
Figure 7:
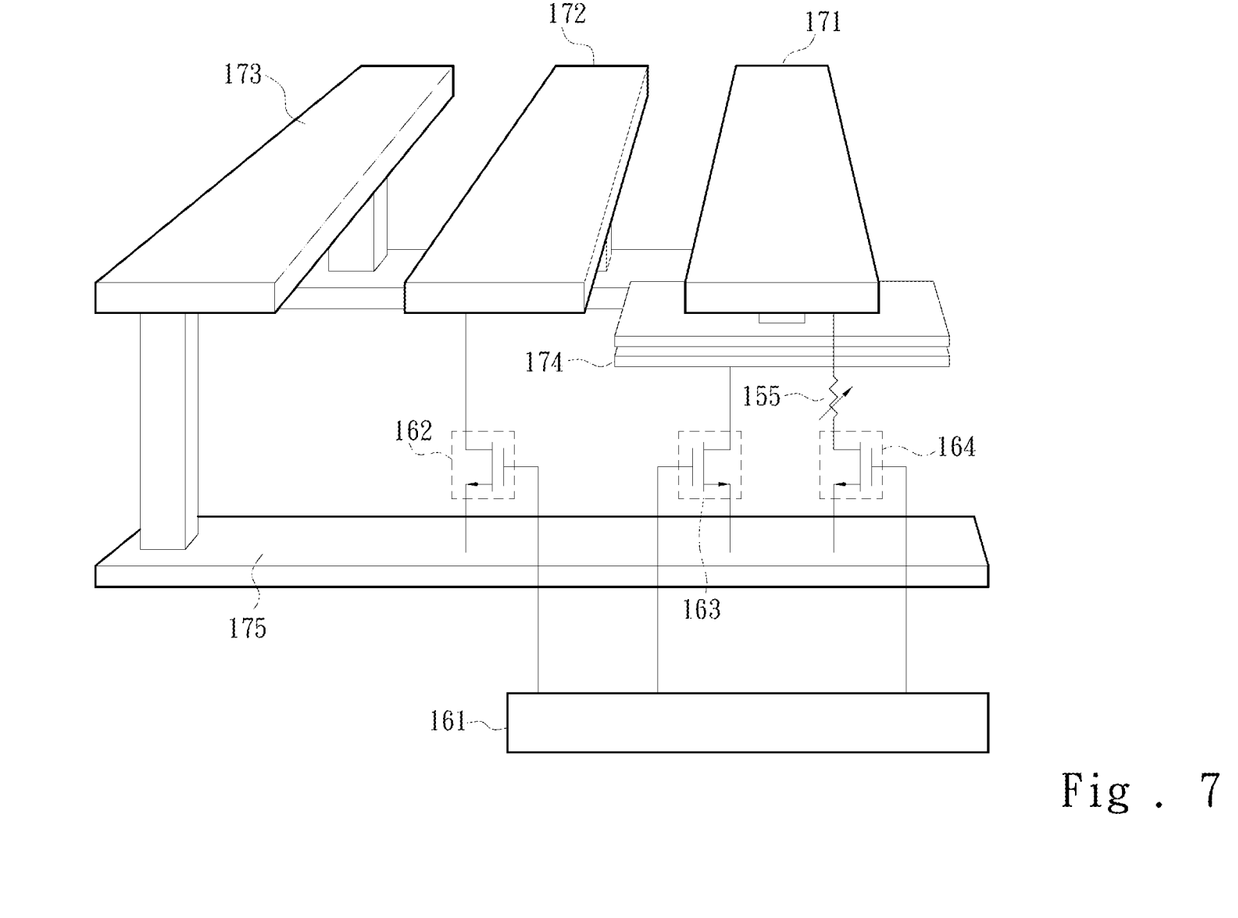
FIG. 7 is a schematic diagram of an integrated structure of a transmission unit according to another embodiment of the present invention.
Figure 8:
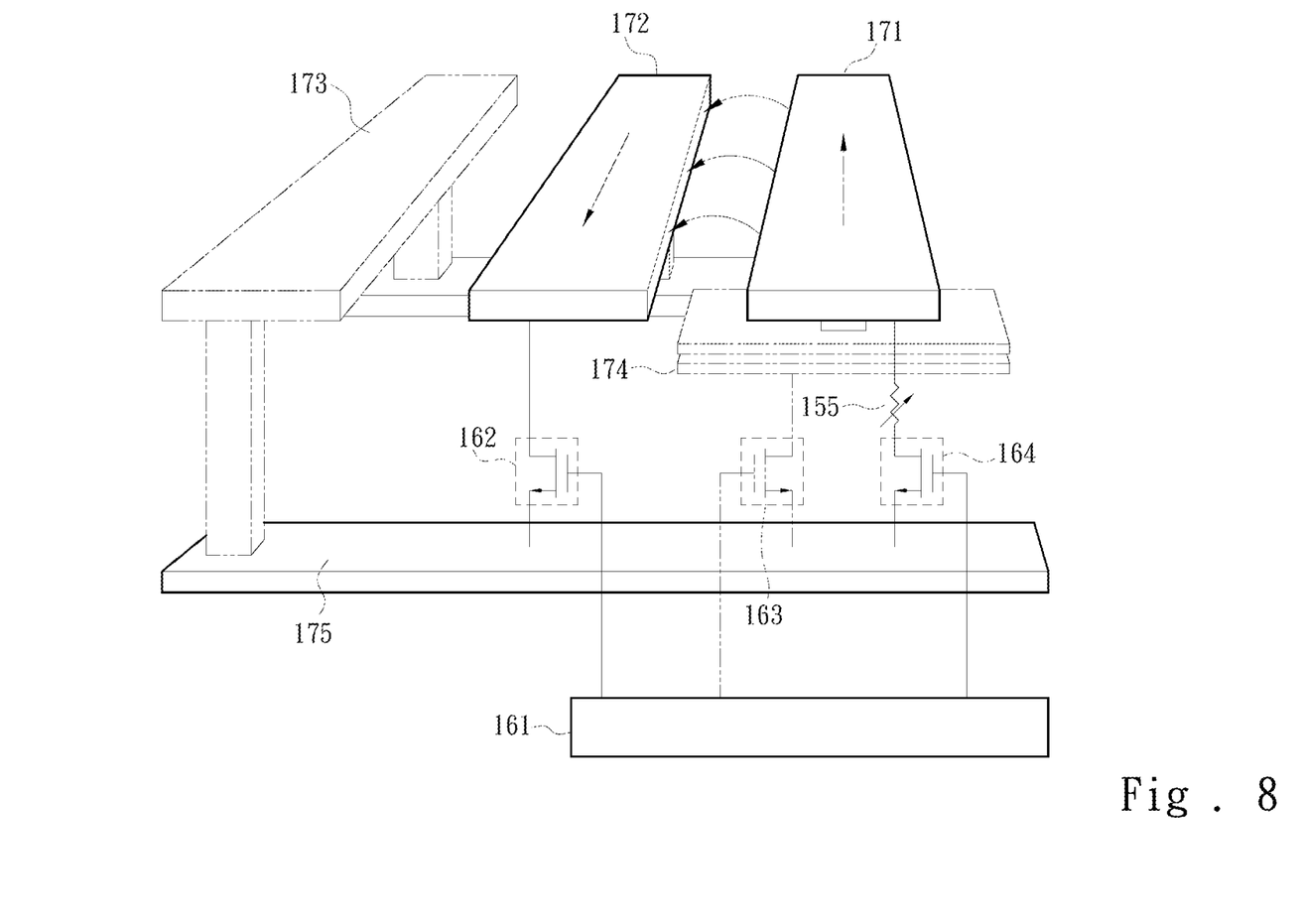
FIG. 8 is a status schematic diagram of a transmission unit in a low delay mode according to another embodiment of the present invention.
Figure 9:
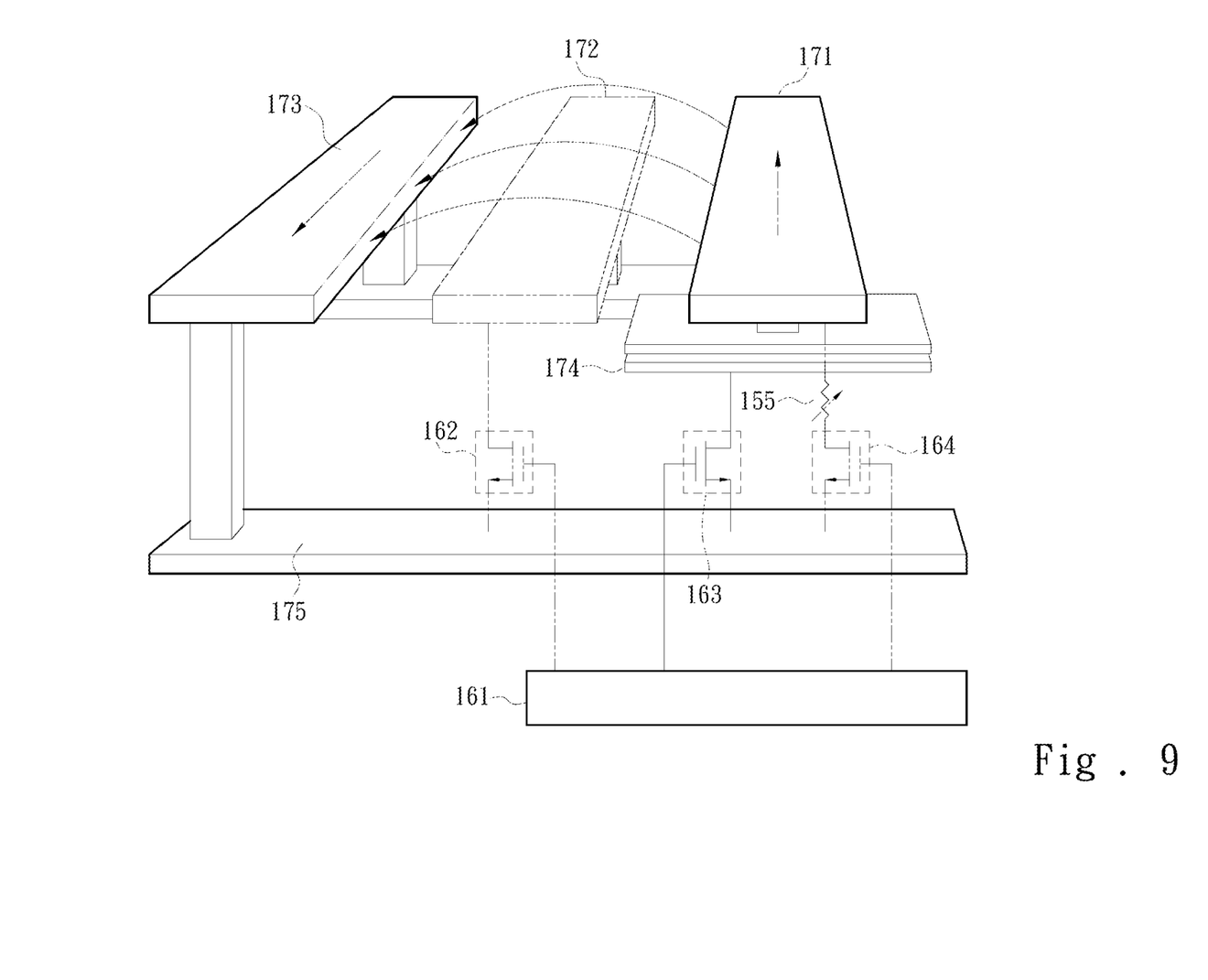
FIG. 9 is a status schematic diagram of a transmission unit in a high delay mode according to another embodiment of the present invention.

Accordingly, the electrical characteristics of the variable inductor 153 are formed on the basis of the conduction status of the second metal conductor 172 and the third metal conductor 173, and the electrical characteristics of the variable capacitor 154 are formed on the basis of the conduction status of the capacitor structure 174. Further, it is known from the foregoing description that, the plurality of passive phase adjustors 152 may be digitally controlled, and the so-called "digitally controlled" refers to the control signal including an activation/deactivation which determines the signal of the plurality of third switches 162 and the plurality of fourth switches 163. Thus, the plurality of passive phase adjustors 152 are controlled to enter the low delay mode or the high delay mode. Referring to FIG. 5, when the plurality of third switches 162 are conducted and the second metal conductor 172 is caused to be grounded. The first metal conductor 171 serving as a signal line is close to the second metal conductor 172 currently grounded such that the magnetic flux is small to cause the inductance value of the variable inductor 153 to be decreased. Meanwhile, the plurality of fourth switches 163 are cut off such that the capacitance value of the variable capacitor 154 is also decreased. Hence, the plurality of passive phase adjustors 152 enter the low delay mode. On the other hand, referring to FIG. 6, when the plurality of third switches 162 are cut off, the first metal conductor 171 serving as a signal line is away from the second metal conductor 172 that is grounded, such that the magnetic flux is large to cause the inductance value of the variable inductor 153 to be increased. Meanwhile, the plurality of fourth switches 163 are conducted to cause the capacitance value of the variable capacitor 154 to be increased. Hence, the plurality of passive phase adjustors 152 enter the high delay mode. Further, in the first embodiment disclosed in FIG. 4 and FIG. 5, the second metal conductors 172 and the third metal conductors 173 are implemented in a symmetrical arrangement according to the implementation requirements of the high delay mode and the low delay mode. That is to say, the second metal conductors 172 are provided on each of two sides of the first metal conductor 171, and one side of second metal conductors 172 that does not face the first metal conductor 171 is provided with the third metal conductors 173. However, the present invention is not limited to being implemented by the above structure. Alternatively, the first metal conductor 171 may be provided with the second metal conductors 172 on only one side thereof, and the third metal conductors 173 may be arranged side by side on the other side of the second metal conductors 172. The transmission unit 15 is as shown in FIG. 7, 8 and. 9. FIG. 8 shows a status schematic diagram of the transmission unit 15 in the low delay mode according to this embodiment, and FIG. 9 is a status schematic diagram of the transmission unit 15 in the high delay mode according to another embodiment.

Each of the plurality of passive phase adjustors 152 is regarded as one unit structure, as shown in the drawings. The lengths of each of the plurality of passive phase adjustors 152 disposed correspondingly to the transmission line 151 are equal, and the lengths are determined according to different implementation requirements. Further, for the RF signal of a specific frequency, the phase delay of each of the plurality of passive phase adjustors 152 is equal to a product of the length of each of the plurality of passive phase adjustors 152 and the wavenumber k. Thus, the degree of phase delay is able to be changed through adjusting the wavenumber k since the length of each of the plurality of passive phase adjustors 152 is constance.

In one embodiment, each of the plurality of passive phase adjustors 152 further includes a variable resistor 155 connected to the transmission line 151, and the controller 16 includes a plurality of fifth switches 164 respectively connected to the each variable resistor 155 of the plurality of passive phase adjustors 152, in order to change the status of the variable resistors 155. The variable resistors 155 and the plurality of fifth switches 164 may be implemented in form of integrated circuits. The variable resistor 155 is connected to the first metal conductor 171, and is controlled by the plurality of fifth switches 164. When the plurality of fifth switches 164 are conducted, the plurality of variable resistors 155 become electrically connected to the first metal conductor 171, so as to change the degree of loss of the RF signal on the transmission line 151. Further, the plurality of fifth switches 164 may control the plurality of variable resistors 155 according to whether the transmission unit 15 enters the low delay mode or the high delay mode. In one embodiment, when the transmission unit 15 is in the low delay mode, the plurality of fifth switches 164 are conducted such that the transmission line 151 is connected in parallel to the plurality of variable resistors 155 and the conduction resistance of the plurality of fifth switches 164, thus increasing the overall resistance value and loss. On the other hand, when the transmission unit 15 is in the high delay mode, the plurality of fifth switches 164 are cut off such that the resistance value on the transmission line 151 is reduced. Therefore, the loss of transmission unit 15 in the low delay mode is approached to the loss of transmission unit 15 in the high delay mode so as to minimize the loss of each passive phase adjustor 152 in the operating frequency band. Further, the resistance value of the variable resistors 155 and the size of the element of the plurality of fifth switches 164 are appropriately adjusted according to implementation requirements. Again referring to FIG. 1, in the first embodiment, the RF transceiving front-end circuit 100 further includes a second transceiving switch 18 connected to the transmission unit 15, the reception processing unit 13 and the transmission processing unit 14. The second transceiving switch 18 comprises a second signal receiving path 181 connected to the transmission line 151 and the first phase shifter 133, and a second signal transmitting path 182 connected to the transmission line 151 and the second variable gain amplifier 143. Further, the structure of the second transceiving switch 18 is as disclosed in FIG. 1, or be replaced by other existing techniques. Further, the second transceiving switch 18 conducts only the second signal receiving path 181 or the second signal transmitting path 182 according to a transceiving status of the RF transceiving front-end circuit 100.

Figure 10:
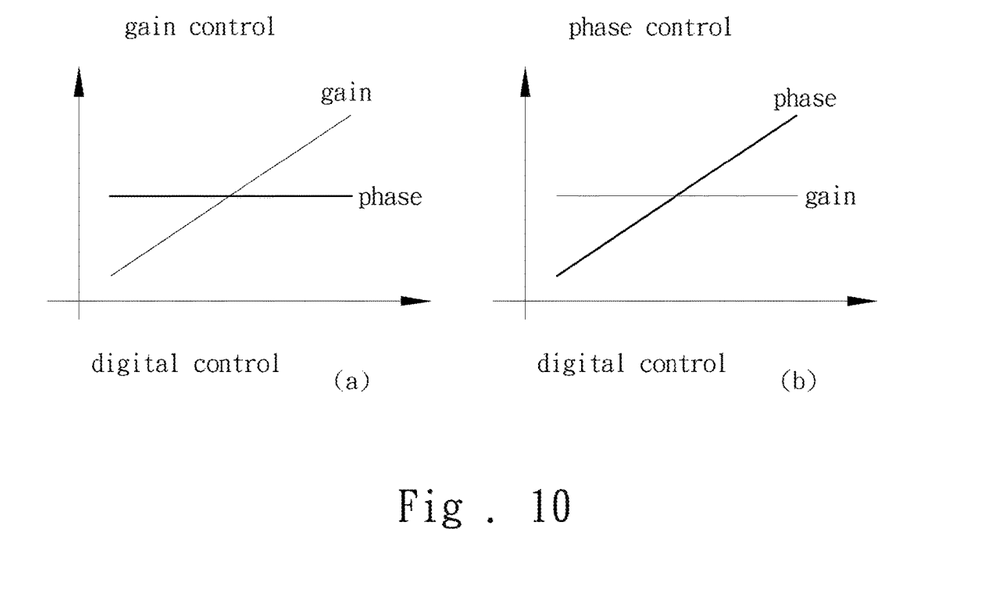
FIG. 10 is a schematic diagram of a radio-frequency (RF) transceiver front-end circuit of the present invention in a state of controlling the gain or phase of an RF signal.
Figure 11:
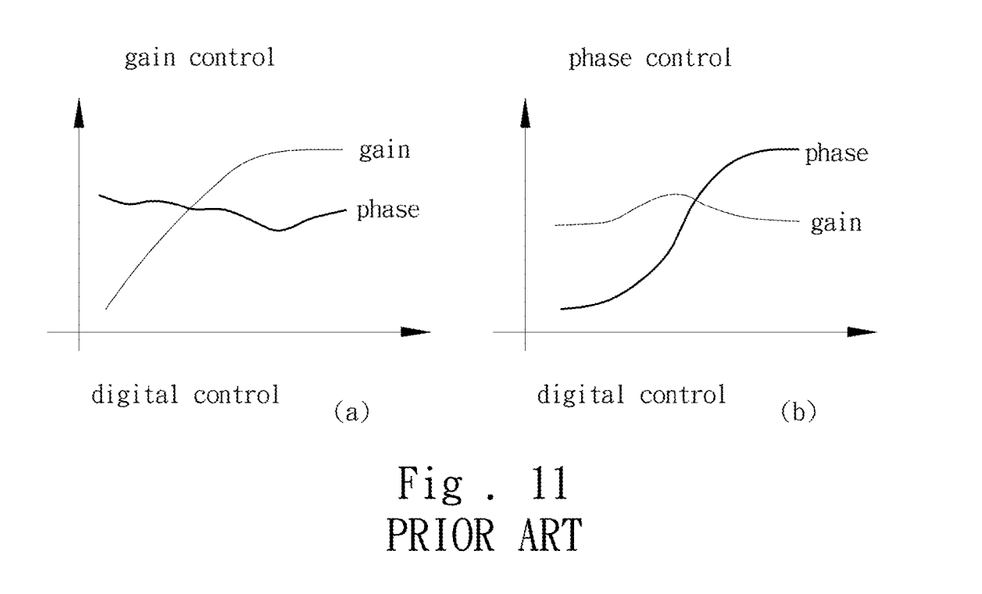
FIG. 11 is a schematic diagram of a conventional RF transceiver front-end circuit in a state of controlling the gain or phase of an RF signal.

Referring to FIG. 10 and FIG. 11, FIG. 10 shows a schematic diagram of the RF transceiving front-end circuit 100 of the present invention in a state of controlling the gain or phase of the RF signal, and FIG. 11 shows a schematic diagram of a conventional RF transceiver front-end circuit in a state of controlling the gain or phase of the RF signal. It is known from FIG. 10($a$) that, when the present invention adjusts the gain of the RF signal, the phase of the RF signal stays unchanged. Conversely, in FIG. 11($a$), the phase of the RF signal cannot be kept constant but changes as the conventional solution adjusts the gain of the RF signal. Further, it is known from FIG. 10($b$) that, when the present invention adjusts the phase of the RF signal, the gain of the RF signal stays unchanged. However, as known from FIG. 11($b$), the gain of the RF signal cannot be kept constant but changes as the conventional solution adjusts the phase of the RF signal. In addition, the RF transceiving front-end circuit 100 achieves accurate beam control.

What is claimed is:

1. A radio-frequency (RF) transceiver front-end circuit, comprising:
   an antenna;
   a first transceiving switch connected to the antenna, and including a first signal receiving path and a first signal transmitting path;
   a reception processing unit, comprising a low-noise amplifier connected to the first signal receiving path, a first variable gain amplifier provided at a back-end circuit of the low-noise amplifier, and a first phase shifter provided at a back-end circuit of the first variable gain amplifier, wherein a phase of the first variable gain amplifier is constant;

a transmission processing unit, comprising a power amplifier connected to the first signal transmitting path, a second phase shifter provided at a front-end circuit of the power amplifier, and a second variable gain amplifier provided at a front-end circuit of the second phase shifter, wherein a phase of the second variable gain amplifier is constant; and a transmission unit connected to the first phase shifter and the second variable gain amplifier, the transmission unit comprising a transmission line and a plurality of passive phase adjustors, the plurality of passive phase adjustors individually provided correspondingly to the transmission line and controlled to change a phase shifting angle of an RF signal on the transmission line.

2. The RF transceiver front-end circuit of claim 1, wherein a phase shifting range of the plurality of passive phase adjustors is at least 180 degrees.

3. The RF transceiver front-end circuit of claim 2, wherein a phase shifting angle of each of the first phase shifter and the second phase shifter is 180 degrees.

4. The RF transceiver front-end circuit of claim 3, wherein
each of the plurality of passive phase adjustors comprises a variable inductor connected to the transmission line and controlled to change a phase of the RF signal transmitted on the transmission line, and a variable capacitor connected to the transmission line and controlled to change the RF signal transmitted on the transmission line; and a control unit comprises a main control unit, a plurality of third switches individually connected to the main control unit and controlled to change a status of one of the variable inductors, and a plurality of fourth switches individually connected to the main control unit and controlled to change a status of one of the variable capacitors.

5. The RF transceiver front-end circuit of claim 2, further comprising:
a controller, connected to the plurality of passive phase adjustors, the controller including a plurality of identifiers respectively corresponding to the plurality of passive phase adjustors, the controller controlling the plurality of passive phase adjustors according to the plurality of identifiers.

6. The RF transceiver front-end circuit of claim 5, wherein each of the first phase shifter and the second phase shifter is a switch cascade circuit.

7. The RF transceiver front-end circuit of claim 2, wherein the transmission unit is a slow-wave artificial transmission line.

8. The RF transceiver front-end circuit of claim 2, wherein each of the first phase shifter and the second phase shifter is a switch cascade circuit.

9. The RF transceiver front-end circuit of claim 2, further comprising:
a second transceiving switch, connected to the transmission unit, the reception processing unit and the transmission processing unit, the second transceiving switch including a second signal receiving path connected to the transmission line and the first phase shifter and a second signal transmitting path connected to the transmission line and the second variable gain amplifier.

10. The RF transceiver front-end circuit of claim 1, wherein a phase shifting angle of each of the first phase shifter and the second phase shifter is 180 degrees.

11. The RF transceiver front-end circuit of claim 1, further comprising:
a controller connected to the plurality of passive phase adjustors, the controller including a plurality of identifiers respectively corresponding to the plurality of passive phase adjustors, the controller controlling the plurality of passive phase adjustors according to the plurality of identifiers.

12. The RF transceiver front-end circuit of claim 11, wherein:
each of the plurality of passive phase adjustors comprises a variable resistor connected to the transmission line and controlled to change loss of the RF signal transmitted on the transmission line; and the controller comprises a plurality of fifth switches individually connected to the main control unit and controlled to change a status of one of the variable resistors.

13. The RF transceiver front-end circuit of claim 1, wherein the transmission unit is a slow-wave artificial transmission line.

14. The RF transceiver front-end circuit of claim 1, wherein each of the first phase shifter and the second phase shifter is a switch cascade circuit.

15. The RF transceiver front-end circuit of claim 1, further comprising:
a second transceiving switch connected to the transmission unit, the reception processing unit and the transmission processing unit, the second transceiving switch including a second signal receiving path connected to the transmission line and the first phase shifter and a second signal transmitting path connected to the transmission line and the second variable gain amplifier.

* * * * *